United States Patent
Huang et al.

(10) Patent No.: US 7,035,131 B2
(45) Date of Patent: Apr. 25, 2006

(54) DYNAMIC RANDOM ACCESS MEMORY CELL LEAKAGE CURRENT DETECTOR

(75) Inventors: Chien-Hua Huang, Hsinchu (TW); Chung-Cheng Chou, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 35 days.

(21) Appl. No.: 10/840,098

(22) Filed: May 6, 2004

(65) Prior Publication Data

US 2005/0248976 A1    Nov. 10, 2005

(51) Int. Cl.
*G11C 11/24*    (2006.01)

(52) U.S. Cl. .................................... 365/149

(58) Field of Classification Search ............... 365/149, 365/189.07, 189.09, 210, 222
See application file for complete search history.

(56) References Cited

U.S. PATENT DOCUMENTS

| | | | |
|---|---|---|---|
| 5,283,764 A | 2/1994 | Kim et al. | |
| 5,377,152 A * | 12/1994 | Kushiyama et al. | 365/149 |
| 5,576,991 A | 11/1996 | Radjy et al. | |
| 5,642,311 A | 6/1997 | Cleveland et al. | |
| 5,751,627 A * | 5/1998 | Ooishi | 365/149 |
| 6,003,118 A | 12/1999 | Chen | |
| 6,046,932 A | 4/2000 | Bill et al. | |
| 6,184,724 B1 | 2/2001 | Lin | |
| 6,404,687 B1 | 6/2002 | Yamasaki | |
| 6,597,614 B1 | 7/2003 | Nam et al. | |
| 6,603,697 B1 | 8/2003 | Janzen | |
| 6,603,698 B1 | 8/2003 | Janzen | |
| 6,707,744 B1 | 3/2004 | Jo | |
| 6,862,239 B1 * | 3/2005 | Huang et al. | 365/222 |
| 6,898,140 B1 * | 5/2005 | Leung et al. | 365/222 |
| 6,912,150 B1 * | 6/2005 | Portman et al. | 365/149 |
| 2002/0000581 A1 | 1/2002 | Yamasaki | |
| 2002/0009010 A1 | 1/2002 | Hayakawa | |
| 2002/0018387 A1 | 2/2002 | Nam et al. | |
| 2003/0067827 A1 | 4/2003 | Janzen | |
| 2003/0067828 A1 | 4/2003 | Janzen | |
| 2003/0107938 A1 | 6/2003 | Jo | |

* cited by examiner

Primary Examiner—Trong Phan
(74) Attorney, Agent, or Firm—Duane Morris LLP

(57) ABSTRACT

A circuit operable to measure leakage current in a Dynamic Random Access Memory (DRAM) is provided comprising a plurality of DRAM bit cell access transistors coupled to a common bit line, a common word line, and a common storage node, wherein said access transistors may be biased to simulate a corresponding plurality of inactive bit cells of a DRAM; and a current mirror in communication with the common storage node operable to mirror a total leakage current from said plurality of bit cell access transistors when the access transistors are biased to simulate the inactive bit cells.

22 Claims, 7 Drawing Sheets

DYNAMIC RANDOM ACCESS MEMORY CELL LEAKAGE CURRENT DETECTOR

CROSS-REFERENCE TO RELATED APPLICATIONS

This application is related to commonly-assigned, co-pending U.S. patent applications:

Ser. No. 10/841,264, entitled "A Refresh Counter with Dynamic Tracking of Process, Voltage and Temperature Variation for Semiconductor Memory" filed on May 7, 2004; and Ser. No. 10/696,291, entitled "Circuit and Method for Self-Refresh of DRAM Cell Through Monitoring of Cell Leakage Current", filed on Oct. 29, 2003, now U.S. Pat. No. 6,862,239, the contents of each being incorporated by reference herein.

FIELD OF THE INVENTION

The present invention is related to Dynamic Memory and more specifically to measuring the leakage current in Random Access Memory (RAM) cells.

BACKGROUND OF THE INVENTION

Leakage current is a serious problem for deep-submicron CMOS devices. The leakage current of a CMOS device typically can be measured with regard to sub-threshold voltage leakage, junction leakage, gate leakage and gate induced drain leakage currents. Reducing leakage current to lower system power dissipation is presently a challenge in process technology development and circuit innovation.

It is typically difficult to accurately detect or measure very small currents. One method for measuring small leakage currents is to duplicate a large number of devices that each exhibit a very small current leakage so that the accumulation of each of the small leakage currents may amount to a detectable and measurable quantity that is representative of the leakage current of an individual device (i.e., by dividing the total detected current by the number of contributing devices). This approach is used in detecting leakage current in DRAM memories as described below.

A dynamic random access memory (DRAM) memory cell is said to be in an inactive state if its corresponding access transistor is turned "off" by applying voltage VSS or a voltage level VBB lower than VSS on the gate of an n-channel MOS access transistor, or by applying VDD or a voltage level VPP higher than VDD on the gate of a p-channel MOS access transistor. The charge stored in a cell capacitor represents a single bit of information. Unfortunately, the charge stored in the cell capacitor is not held very well when the access transistor is turned off, and it will be gradually lost by leakage current from the access transistor and the capacitor. Therefore, the cells must be refreshed periodically.

As noted, inactive cells exhibit leakage current from the access transistors and dielectric leakage current from the storage capacitors. The leakage current also depends, however, on the information stored in the memory bit cell, i.e., in the storage capacitor; that is, the leakage is different for memory cells holding binary "1" and binary "0". Normally, the leakage current of a single bit is too small for accurate detection. To measure the leakage current of a DRAM cell a large number of memory bit cells, e.g., several thousand cells, are arranged in a structure and biased, as shown in FIGS. 1a and 1b with regard to n-channel and p-channel transistors, respectively. With regard to the monitoring array 100 of FIG. 1a, each dummy memory cell includes an n-channel transistor 110 and a corresponding storage capacitor 135 (labeled Cs). The transistor 110 can be applied a proper bias voltage on its gate to turn "on" or turn "off" the connection between the capacitor and the bit line. N-channel transistors 110 are electrically connected in parallel at corresponding source nodes 112 by a common bit line 120, which may be set to a voltage referred to as VBL. The gate node 114 of each transistor 110 is connected to a common word line 125, which may be set to a voltage referred to as VSSB sufficient to turn transistors 110 off. Each drain node 116 of each transistor 110 is further connected to a substantially similar capacitor 135, each of which is connected to a common voltage plate 140. Common voltage plate 140 has a voltage, referred to as VCP, applied thereto. The drain node 116 of each transistor 110 is further electrically connected to a common extraction node 130 that allows for the measurement of an accumulated leakage from all coupled transistors 110 and capacitors 135.

As noted above, FIG. 1B illustrates a prior art monitoring circuit 101 comprising cells including p-channel transistors 111 and storage capacitors Cs 135. The biasing conditions for extracting leakage current are also illustrated therein, with source nodes 112 coupled to common bit line to received bit line voltage $V_{BL}$, drain nodes 116 coupled to leakage current extraction node 130 and capacitors 135, and gate nodes 114 coupled to common word line 125 to receive common word line voltage $V_{PP}$, which turns transistors 111 "off". Capacitors 135 are coupled between sources 116 and common plate node 140.

The addition to a DRAM memory of a current detector as shown in FIG. 1a or 1b, which requires thousands of dummy sample memory cells, requires a considerable amount of area or space, particularly as the number of bits cells to monitor increases. In addition, it is difficult to utilize the illustrated structure in a practical implementation because leakage current extraction node 130 must be biased at a stable voltage level. In one case, the extraction node 130 must be 0V or close to 0V for extracting leakage current when simulating a memory cell holding the charge of 0V, or so called '0'-state. In the opposite case, the extraction node 130 must be VDD or close to VDD for extracting leakage current when simulating memory cells storing data '1'. If any disturbance in the voltage or any voltage swing occurs at extraction node 130, these constraints may not be satisfied and the circuit may not operate properly.

Therefore, there is a need for a current monitoring method and circuit that can measure a leakage current that does not use significant area. Further, there is a need for a current monitoring method and circuit that are not affected by the extraction voltage level.

SUMMARY OF THE INVENTION

A circuit operable to measure leakage current in a Dynamic Random Access Memory (DRAM) is provided comprising a plurality of DRAM bit cell access transistors coupled to a common bit line, a common word line, and a common storage node, wherein said access transistors may be biased to simulate a corresponding plurality of inactive bit cells of a DRAM; and a current mirror in communication with the common storage node operable to mirror a total leakage current from said plurality of bit cell access transistors when the access transistors are biased to simulate the inactive bit cells.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

Figure 1A:
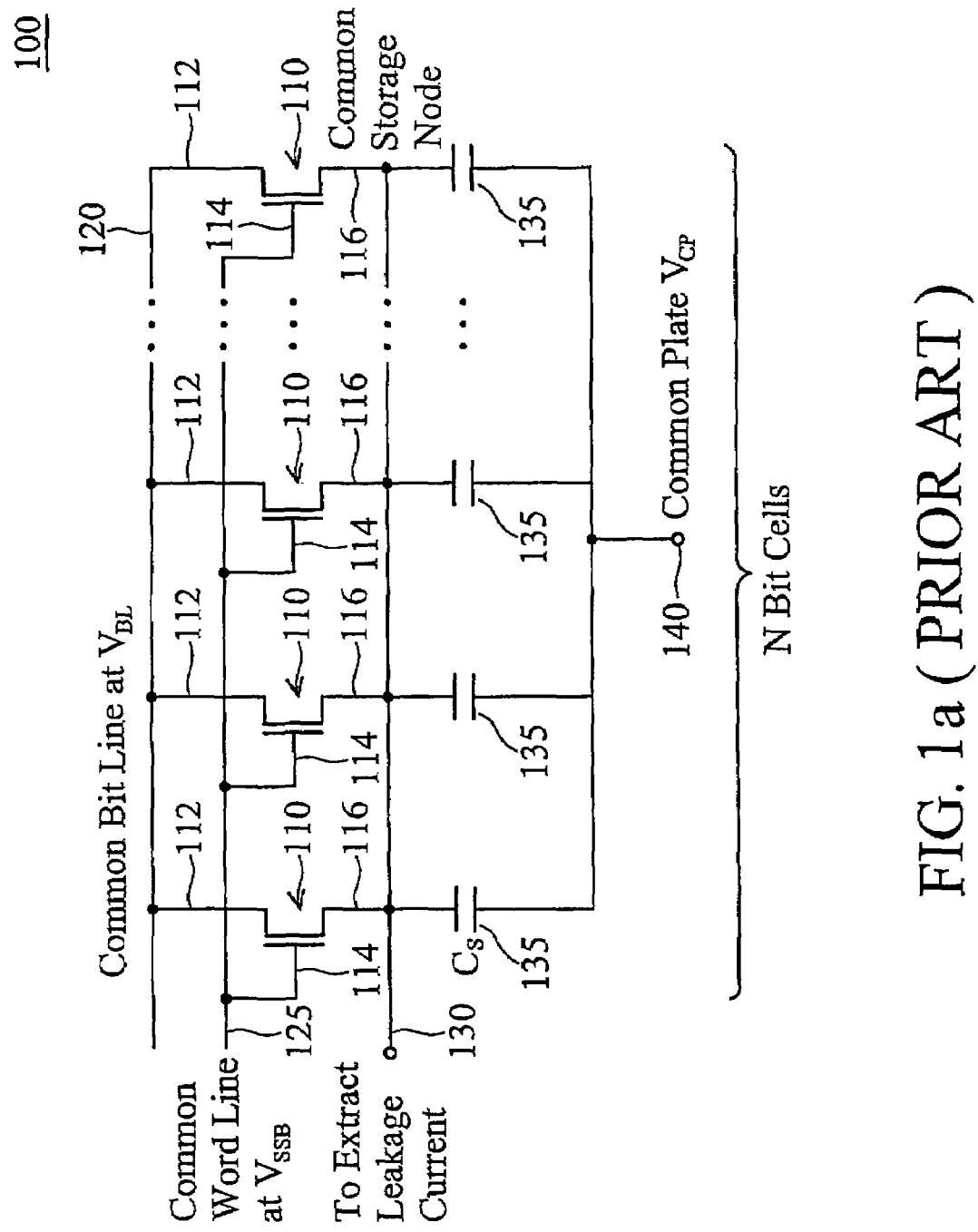
FIGS. 1a and 1b illustrate conventional current leakage detector circuitry for NMOS and PMOS type DRAMs, respectively.

It is to be understood that these drawings are solely for purposes of illustrating the concepts of the invention and are not intended as a definition of the limits of the invention. The embodiments shown herein and described in the accompanying detailed description are to be used as illustrative embodiments and should not be construed as the only manner of practicing the invention. Also, the same reference numerals, possibly supplemented with additional reference characters where appropriate, have been used to identify similar elements.

DETAILED DESCRIPTION

Figure 2A:
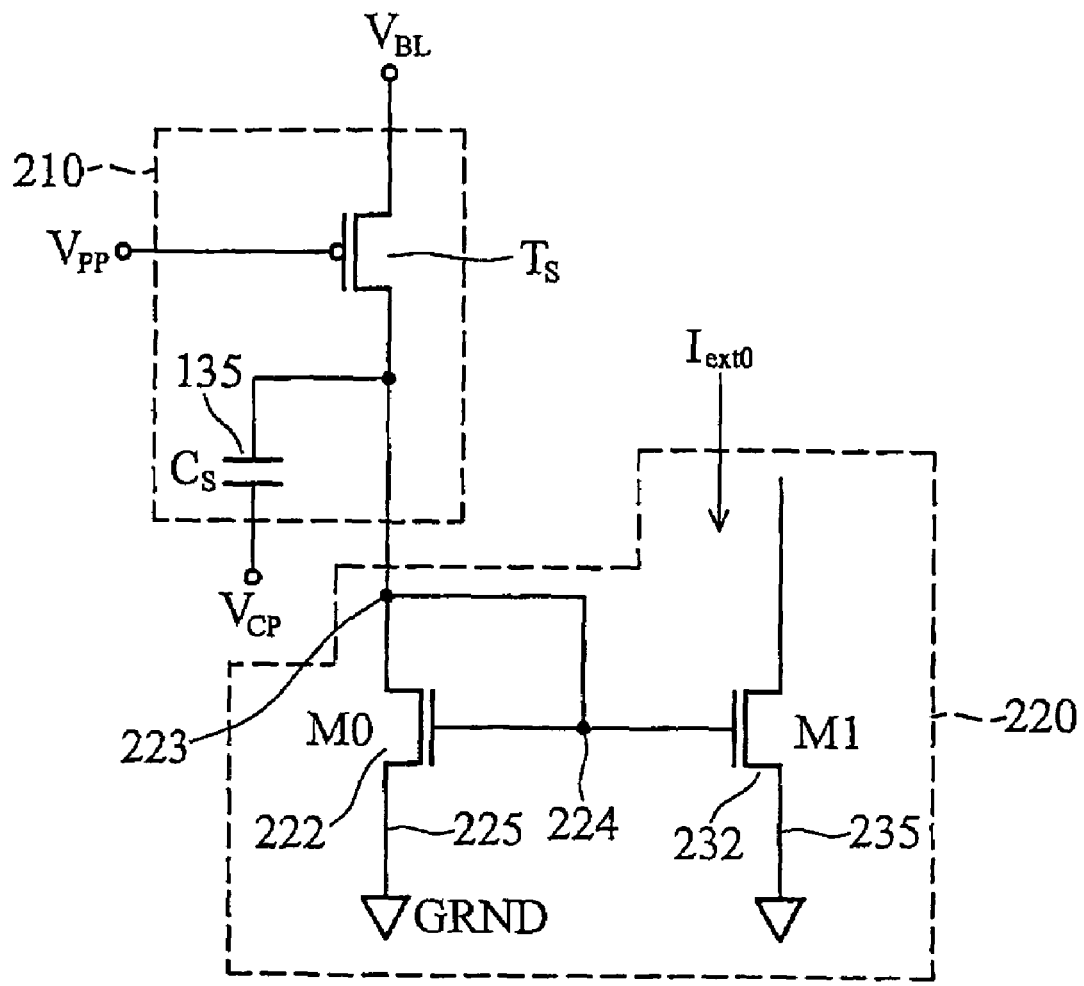
FIGS. 2a and 2b illustrate an exemplary embodiment of current leakage detector circuitry in accordance with the principles of the present invention for PMOS and NMOS logic, respectively.

FIG. 2a illustrates one embodiment 200 for measuring memory leakage current when a binary zero (0) is stored in a memory cell of a p-channel DRAM. The monitoring circuit comprises a DRAM memory array 210 having N-bit cells of a p-channel DRAM. It should be understood that N Bit Cells 210 comprise N number of access transistors Ts with corresponding N number of capacitors Cs. In this illustrated embodiment, a current detector or mirror circuit 220 for collecting and amplifying leakage current from sample DRAM 210 is coupled to DRAM 210 and comprises a first n-type or n-channel MOS (metal oxide semiconductor) transistor 222 (labeled M0) having its source node electrically connected to a common point, i.e., storage or source node 223, across each capacitor Cs (labeled 135) associated with the N-bit cells. Source node 223 is further connected to gate node 224 of first transistor 222 and second n-type MOS transistor 232 (labeled M1). Drain node 225 of first current mirror transistor 222 and drain node 235 of second current mirror transistor 232 are connected to a common ground point.

In this embodiment 200 comprising DRAM 210 including PMOS transistors $T_S$, the gate terminal of each transistor $T_S$ is coupled to a boosted power supply voltage, $V_{PP}$, which is higher than VDD. This boosted power supply voltage source is used to establish the transistors Ts in a turned-off state to simulate inactive bit cells. The source terminal of each transistor $T_s$ is coupled to a bit line having voltage $V_{BL}$. Capacitors $C_S$ coupled to the drain terminals of the transistors in array 210 may also be coupled to a cell plate voltage $V_{CP}$.

As noted, all nodes of the DRAM cells 210 are coupled to a respective proper bias voltage to set the memory bit cell in an inactive state, except for the storage node. In this embodiment, the storage node or extraction node 223 will self bias at a voltage close to 0V as the extraction current from N-bit cell DRAM 210 must be current-sunk through NMOS 222. Therefore, the extraction current will establish a voltage bias a little higher than zero volts (0V) at the gate terminal 224 of NMOS 222, i.e., at storage node 223. Because the storage node 223 is tuned at a voltage level less than Vt of transistor M0, it approximates the state of storing binary zero in the N Bit cells. As the storage node 223 is stably biased around 0V, the current flow through NMOS 222 can be identified as the total leakage current from the "0" state N bit cells 210, i.e., the total leakage current from the transistors Ts and the capacitors Cs. If the leakage from the capacitors Cs is negligible, the capacitors could be removed without any functional impact.

The second NMOS 232 in the current mirror structure 220 can duplicate the current passing or sinking through NMOS 222 as their gate nodes are coupled and the transistors 222, 232 have substantially the same cross voltage $V_{GS}$ between their respective gate and source nodes, i.e., ground. Therefore, the current $I_{ext0}$ through NMOS 232 is substantially the same as that provided through NMOS 222 or a multiple thereof described below.

Current mirror circuit 220 may generate a weighting factor of the "0" state leakage current by using a ratio of a characteristic of first NMOS transistor 222 to a corresponding characteristic of second NMOS transistor 232, e.g., a physical characteristic. For example, if the characteristic is a physical dimension such as channel length, the first leakage current that flows through second NMOS 232 may be around twice the leakage current flowing through first NMOS transistor 222 if the channel length of second NMOS transistor 232 is around twice the channel length of first NMOS transistor 222. Accordingly, the sizes of first and second NMOS transistors 222 and 232, respectively, may be used to create a current weighting factor for the "0" state leakage current. Therefore, the current $I_{ext0}$ may be a multiple of the total leakage current through the cells.

Figure 1B:
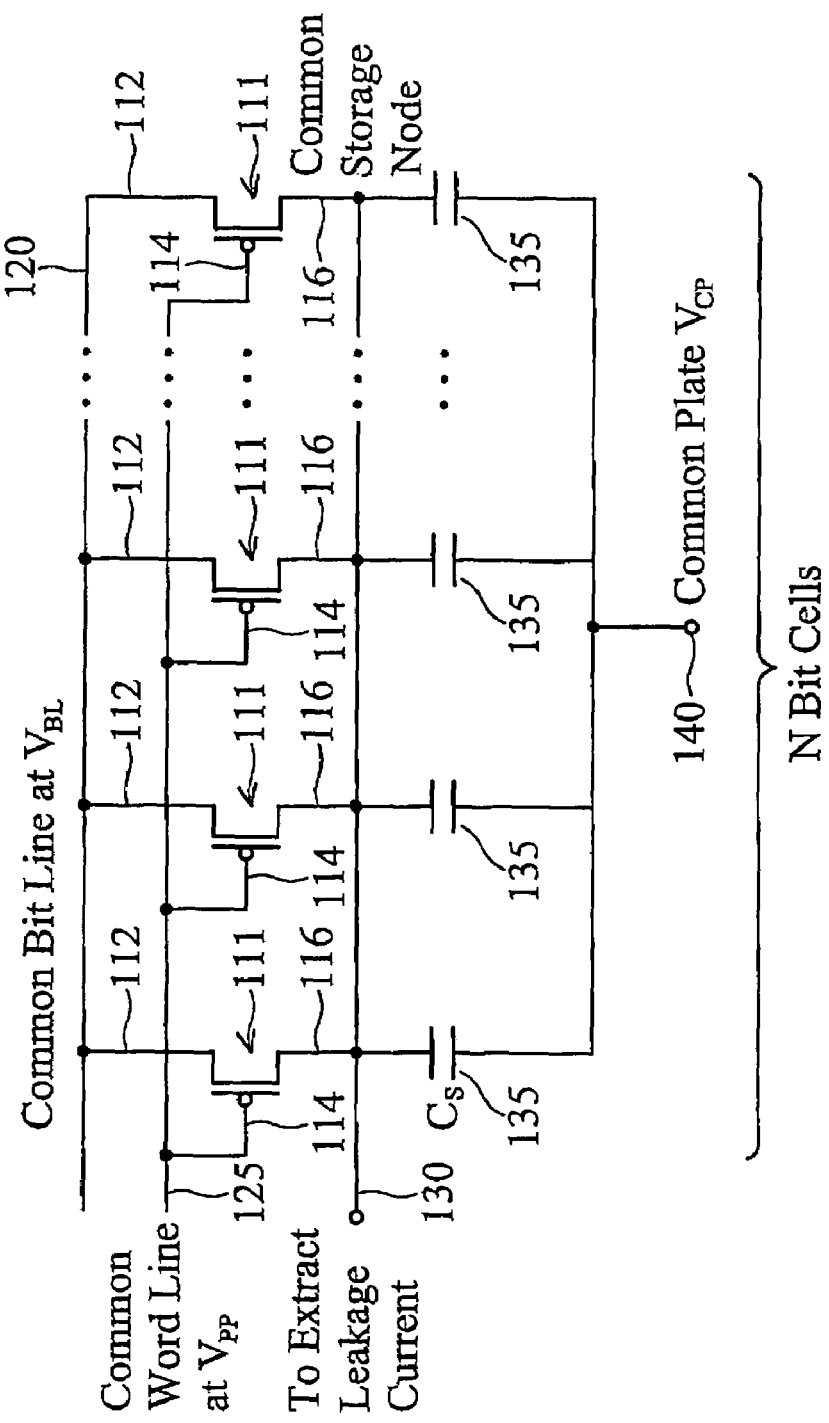

While there is no requirement as to how many cells need to be in "0" state cell array 210, it is advantageous that the magnitude of the leakage currents from "0" state cell array 210 be sufficiently large to be sensed by current mirror circuit 220. An exemplary sample size N for embodiment 200 is less than the several thousand sample cells of the prior art (FIGS. 1a and 1b), and is preferably in the range of several hundred sample cells or even less. Cell array 210 should also be fabricated in close proximity to the physical DRAM memory array it monitors (or, more specifically, simulates) so that it is subject to the same environmental conditions, such as temperature and voltage biases.

Figure 2B:
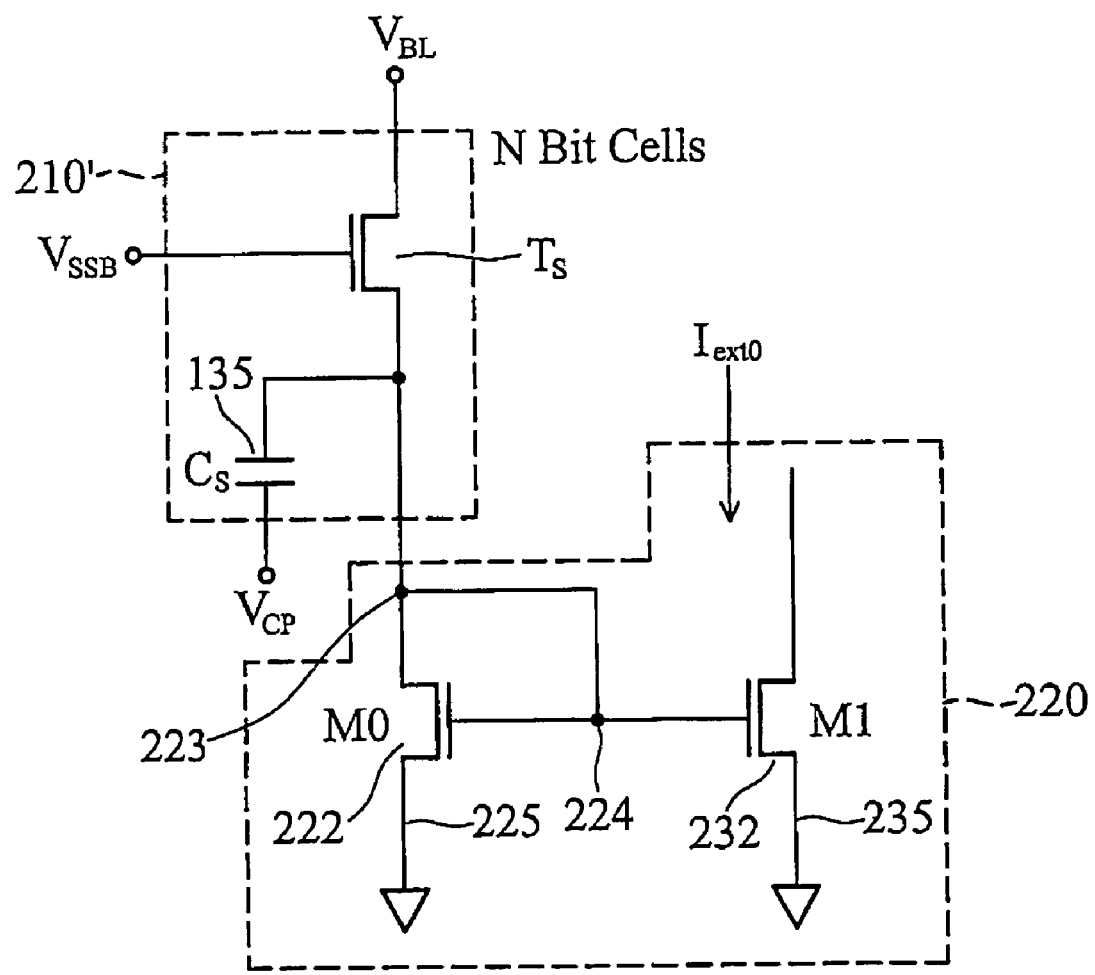

FIG. 2b illustrates a leakage current monitoring structure 201 comprising N bit cells 210, which comprises NMOS transistors Ts and corresponding capacitors $C_s$, and mirroring circuitry 220. Like references to FIG. 2a indicate like features in FIG. 2b. In this embodiment, voltages applied to the gate terminal of each transistor $T_s$ in "0" state cells 210' may be replaced by back bias voltage, $V_{SSb}$, which is sufficiently low to turn transistors $T_s$ "off". Although not discussed in detail, one skilled in the art would recognize that the operation of the current mirror in measuring extraction current in FIG. 2b is similar to that discussed with regard to FIG. 2a herein.

Figure 3A:
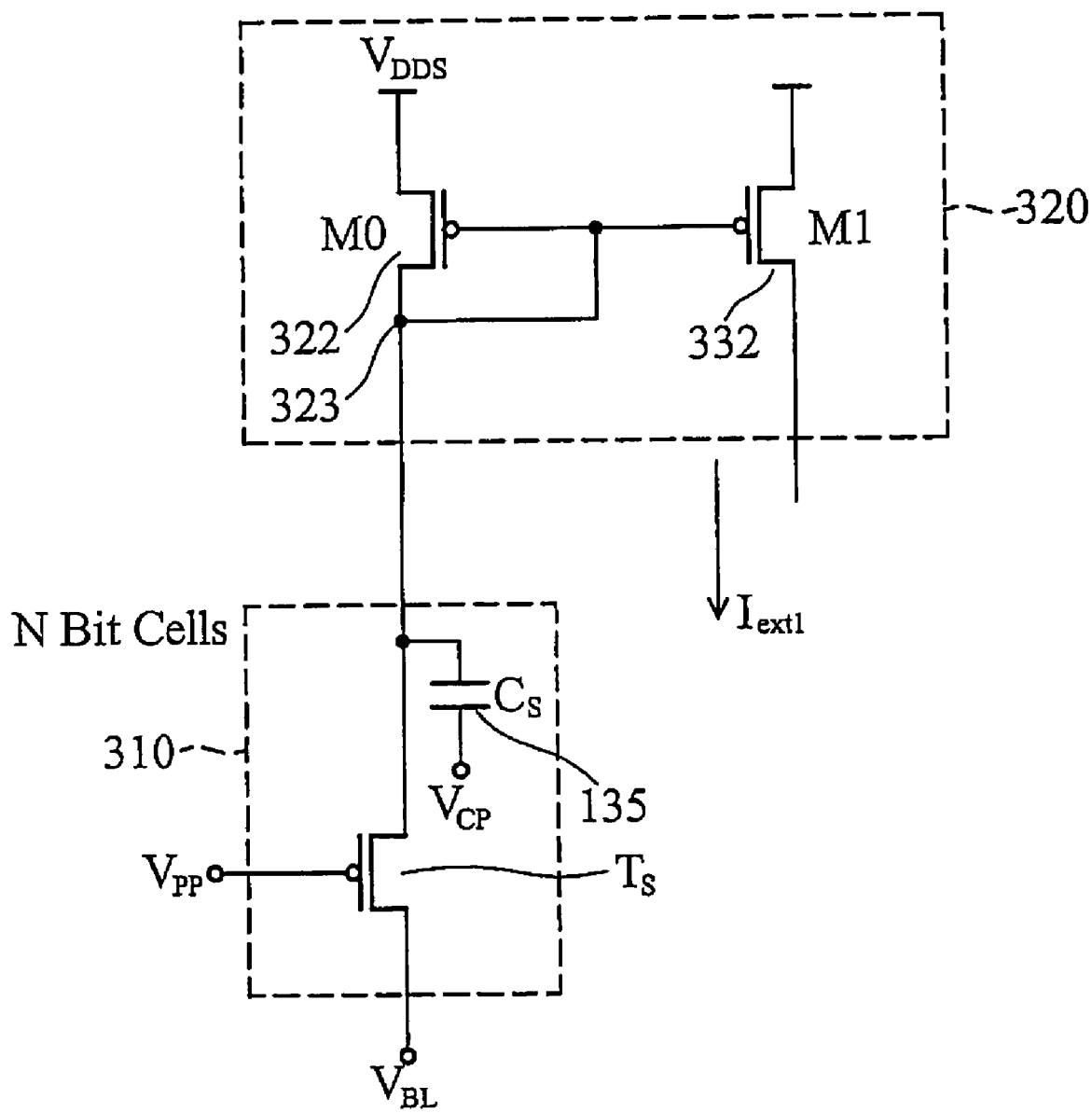
FIGS. 3a and 3b illustrate a second exemplary embodiment of current leakage detector circuitry for PMOS and NMOS logic, respectively.

FIG. 3a is a schematic configuration of an exemplary embodiment 300 of a current monitor including a N-bit DRAM 310, which comprises p-channel MOS transistors (PMOS) $T_s$ and corresponding capacitors Cs, and current mirror 320. In this embodiment, the monitoring circuit 300 monitors leakage current for simulated cells in the "1" state. The storage node of each capacitor $C_s$ in array 310 is coupled to second current mirror circuit 320. The source terminal of each transistor $T_S$ is coupled to storage node 323. The drain terminal of each transistor $T_S$ is coupled to a bit line voltage, $V_{BL}$ and the capacitor Cs of each cell may be coupled to a cell plate voltage $V_{CP}$. The voltages applied to cells 310 turn transistors $T_S$ off, generating a total leakage current of the "1" state cell array 310 into second current mirror circuit 320. The storage node 323 is self-tuned at a voltage level simulating approximately the state of storing binary "1".

In the embodiment 300, second current mirror circuit 320 comprises two PMOS transistors 322 and 332. First PMOS transistor 322 is coupled to storage node 323 of $C_S$. The gate terminal of second PMOS transistor 332 is coupled to the gate terminal of first PMOS transistor 322, which is further coupled to storage node 323. The leakage current generated from the "1" state cells in array 310 flows through first PMOS transistor 322, which couples the leakage current to the second PMOS transistor 332 creating a current flow that may be monitored. Better approximation of the '1' state cells may be achieved by tuning VDDS to a higher voltage than VDD. If the leakage from the capacitors Cs is negligible, the capacitors could be removed without any functional impact.

In some embodiments, second current mirror circuit 320 may generate a weighting factor by using a ratio of a characteristic of first PMOS transistor 322 to a corresponding characteristic of second PMOS transistor 332 as previously discussed. An example of such multiplication may occur for example, wherein second leakage current flowing through second PMOS transistor 332 may be around twice the leakage current flowing through first PMOS transistor 322 if the channel length of second PMOS transistor 332 is twice the channel length of first PMOS transistor 322. As would be appreciated, in this instance the term "multiple" in addition to its commonly used term may also be used to indicate a one-to-one multiple, i.e., multiplicative factor equal to 1.

Figure 3B:
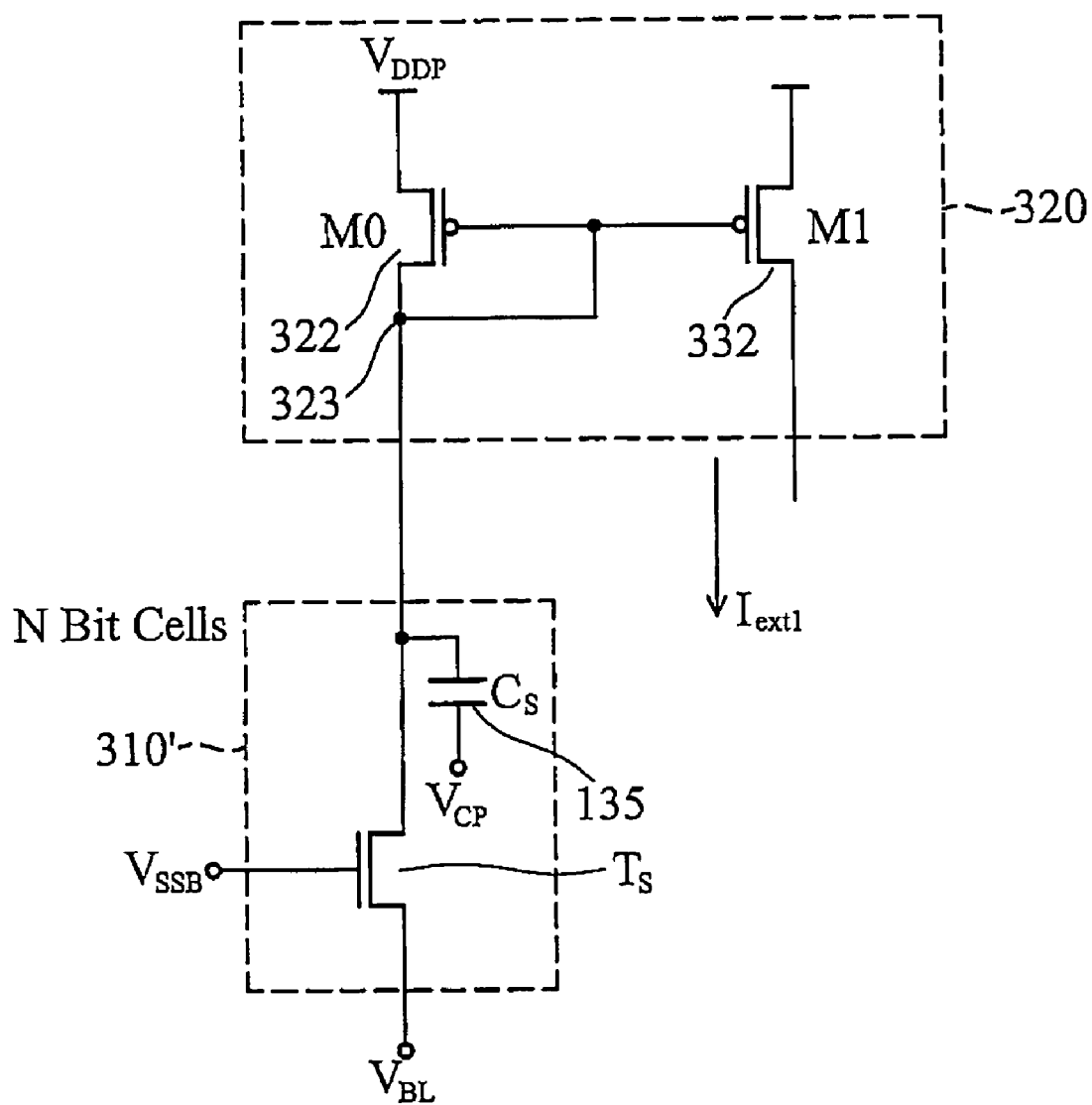

FIG. 3b illustrates an embodiment 301 using similar current mirror configuration 320 associated with N-bit cells 310' of n-channel MOS (NMOS) transistors TS. One skilled in the art would recognize that the operation of the current mirror in measuring extraction current in FIG. 3b is similar to that discussed with regard to FIG. 3a herein. Better approximation of the '1' state cells may be achieved by tuning VDDP to a higher voltage than VDD.

Figure 4:
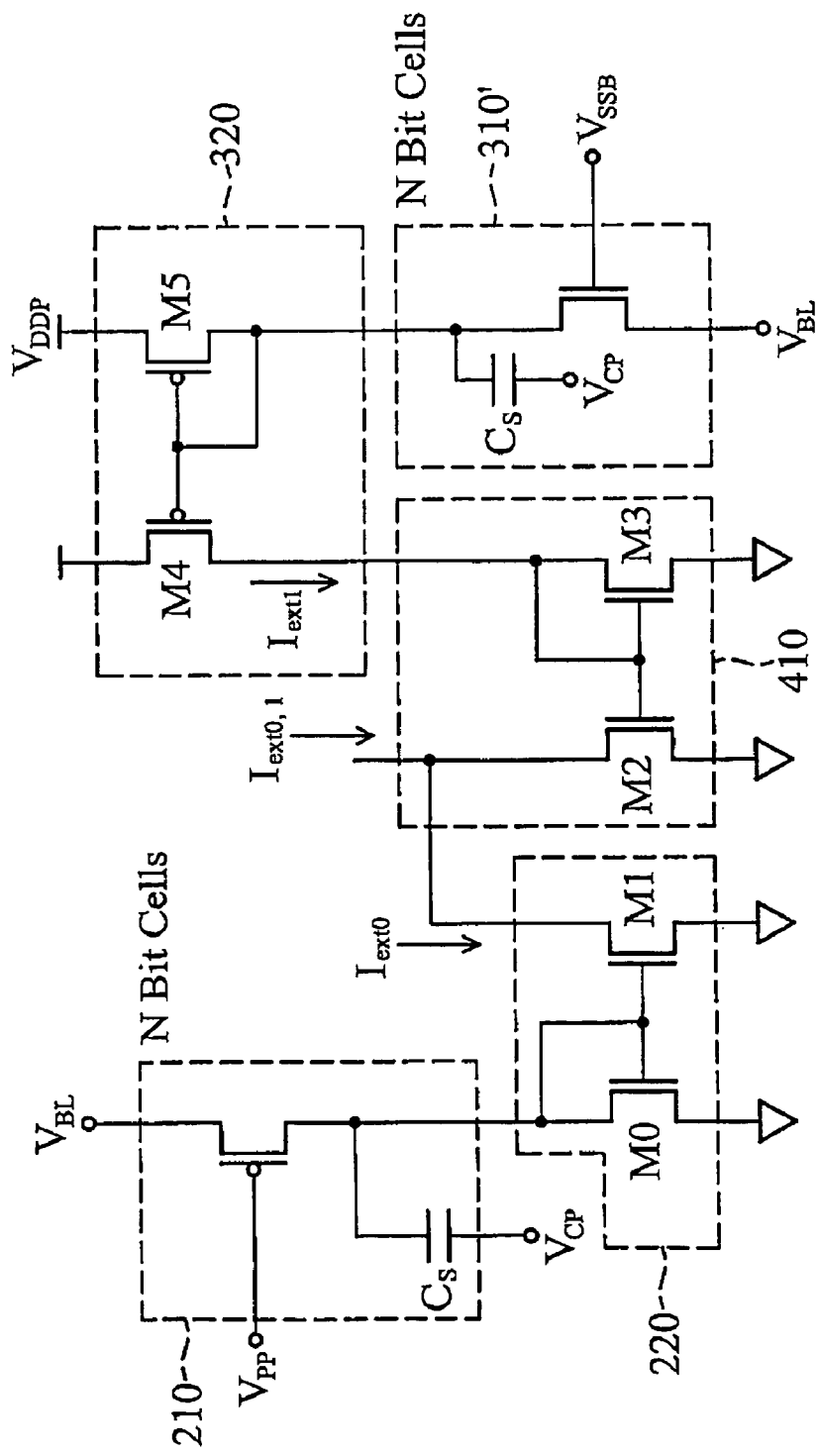
FIG. 4 illustrates an exemplary embodiment of a memory cell leakage monitor in accordance with the principles of the present invention for simultaneously monitoring leakage current in both programmed and unprogrammed cells.

FIG. 4 illustrates an embodiment 400 for measuring together leakage current for both "0" and "1" state N-bit cell DRAMS 210 and 310', respectively. In this embodiment, first current monitor (mirror circuit) 220 measures leakage current associated with dummy "0" state N-bit cell DRAM array 210 as described above with regard to FIG. 2a and second current monitor (mirror circuit) 320 measures leakage current associated with dummy "1" state N-bit cell DRAM array 310' as described above with regard to FIG. 3b. The respective leakage currents are applied to a third mirror circuit 410 that measures the leakage current as previously described. In this case, M4, i.e., M1 332 referred to in FIG. 3b, is a current supplier and supplies current $I_{ext1}$, whereas M1, i.e., M1 232 referred to in FIG. 2a, is a current sinker and will sink current $I_{ext0}$, thereby providing total leakage current $I_{ext0,1}$ at M2 of third current mirror 410.

Although not shown, N-bit cells 210' and N-bit cells 310 may be substituted for N bit cells 210 and N bit cells 310', respectively, in an alternative DRAM configuration.

The leakage current monitoring circuitry described herein provide leakage current detection for DRAM cells while minimizing space usage and voltage dependency. Because the leakage current in DRAM cells strongly depends on the applied bias voltage, process deviation and operating temperature, the detected leakage current can be used as a window into the environmental conditions of the DRAM array. For instance, the charge of memory cells in DRAM arrays must be refreshed periodically. But, the refresh period is fully determined by the capacitance of the cell capacitor and leakage current. The extracted leakage current can be used to dynamically and in real-time determine the refresh period dependent upon a variety of operating environment conditions discerned from the detected leakage current, such as temperature or applied voltage. Further, in usage, the leakage current monitor output can be treated as an ideal current source, since the current output node can accept a large voltage swing and it does not generate disturbance when it is working with other circuits.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A circuit operable to measure leakage current in a Dynamic Random Access Memory (DRAM) comprising:
   a plurality of DRAM bit cell access transistors coupled to a common bit line, a common word line, and a common storage node, wherein said access transistors may be biased to simulate a corresponding plurality of inactive bit cells of a DRAM; and
   a current mirror in communication with said common storage node operable to mirror a total leakage current from said plurality of bit cell access transistors when said access transistors are biased to simulate said inactive bit cells.

2. The circuit as recited in claim 1, wherein said access transistors are selected from the group consisting of NMOS and PMOS transistors.

3. The circuit as recited in claim 1, wherein said current mirror comprises:
   at least two transistors with respective gate nodes electrically connected to said common storage node.

4. The circuit as recited in claim 3, wherein said current mirror transistors are selected from the group consisting of NMOS and PMOS transistors.

5. The circuit as recited in claim 3, wherein said current mirror transistors are selected to measure a multiple of said total leakage current, said multiple being greater than one.

6. The circuit as recited in claim 3, wherein said current mirror comprises at least two NMOS transistors coupled between said common storage node and a ground node, whereby a voltage at said common storage node simulates a voltage reflective of a '0' state DRAM bit cell when said access transistors are biased to simulate said inactive bit cells.

7. The circuit as recited in claim 3, wherein said current mirror comprises at least two PMOS transistors coupled between said common storage node and a supply voltage node, whereby a voltage at said common storage node simulates a voltage reflective of a '1' state DRAM bit cell when said access transistors are biased to simulate said inactive bit cells.

8. The circuit as recited in claim 1, further comprising a plurality of storage capacitors coupled to said storage node, each of said storage capacitors associated with a respective one of said access transistors, wherein said current mirror is operable to mirror a total leakage current from said plurality of bit cell access transistors and said capacitors.

9. A DRAM current meter comprising:
a first current monitor operable to measure a leakage current associated with a cell in a first state;
a second current monitor operable to measure a leakage current associated with a cell in a second state; and
a current mirror in communication with said first and second current monitors wherein said current mirror is operable to mirror a total leakage current measured by said first and second current monitors.

10. The meter as recited in claim 9, wherein said second current monitor provides a current to said current mirror.

11. The meter as recited in claim 10, wherein said current mirror is a current sink for said first current monitor.

12. The meter as recited in claim 9, wherein each of said first and second current monitors composes:
a plurality of DRAM bit cell access transistors coupled to a common bit line, a common word line, and a common storage node, wherein said access transistors may be biased to simulate a corresponding plurality of inactive bit cells of a DRAM; and
a current mirror in communication with said common storage node operable to mirror a total leakage current from said plurality of bit cell access transistors when said access transistors are biased to simulate said inactive bit cells.

13. The meter as recited in claim 12, wherein said each current mirror of said first and second current monitors comprises:
at least two transistors with respective gate nodes electrically connected to said common storage node.

14. The meter as recited in claim 13, wherein said transistors of said current mirrors of said first and second current monitors are selected to measure a multiple of said total leakage current, said multiple being greater than one.

15. The meter as recited in claim 13,
wherein said current mirror of said first current monitor comprises at least two NMOS transistors coupled between said common storage node and a ground node, whereby a voltage at said common storage node simulates a voltage reflective of a '0' state DRAM bit cell when said access transistors are biased to simulate said inactive bit cells, and
wherein said current mirror of said second current monitor comprises at least two PMOS transistors coupled between said common storage node and a supply voltage node, whereby a voltage at said common storage node simulates a voltage reflective of a '1' state DRAM bit cell when said access transistors are biased to simulate said inactive bit cells.

16. The meter as recited in claim 12, wherein said current mirrors of said first and second current monitors each further comprise:
a plurality of storage capacitors coupled to said storage node, each of said storage capacitors associated with a respective one of said access transistors, wherein said current mirror is operable to mirror a total leakage current from said plurality of bit cell access transistors and said capacitors.

17. A Dynamic Random Access Memory (DRAM) comprising a circuit operable to measure simulated leakage current in said DRAM comprising:
a plurality of DRAM bit cells comprising:
a plurality of DRAM bit cell access transistors coupled to a common bit line, a common word line, and a common storage node, wherein said access transistors may be biased to simulate a corresponding plurality of inactive bit cells of a DRAM; and
a plurality of storage capacitors coupled to said storage node, each of said storage capacitors associated with a respective one of said access transistors; and
a current mirror in communication with said common storage node operable to provide a multiple of a total leakage current from said plurality of bit cell access transistors and said capacitors when said access transistors are biased to simulate said inactive bit cells.

18. The DRAM of claim 17, wherein said current mirror comprises:
at least two transistors with respective gate nodes electrically connected to said common storage node.

19. The DRAM of claim 18, wherein said current mirror comprises at least two NMOS transistors coupled between said common storage node and a ground node, whereby a voltage at said common storage node simulates a voltage reflective of a '0' state DRAM bit cell when said access transistors are biased to simulate said inactive bit cells.

20. The DRAM of claim 18, wherein said current mirror comprises at least two PMOS transistors coupled between said common storage node and a supply voltage node, whereby a voltage at said common storage node simulates a voltage reflective of a '1' state DRAM bit cell when said access transistors are biased to simulate said inactive bit cells.

21. The DRAM of claim 17, wherein said DRAM comprises a DRAM array and said circuit is fabricated proximate to said DRAM array, whereby said circuit is exposed to environmental conditions substantially similar to said DRAM memory array.

22. The DRAM of claim 17, wherein said multiple is greater than one.

* * * * *

UNITED STATES PATENT AND TRADEMARK OFFICE
CERTIFICATE OF CORRECTION

PATENT NO. : 7,035,131 B2  
APPLICATION NO. : 10/840098  
DATED : April 25, 2006  
INVENTOR(S) : Chien-Hua Huang and Chung-Cheng Chou Page 1 of 1

It is certified that error appears in the above-identified patent and that said Letters Patent is hereby corrected as shown below:

Column 7, line 24, delete "composes" and insert therefor --comprises--.

Signed and Sealed this

Second Day of January, 2007

JON W. DUDAS  
*Director of the United States Patent and Trademark Office*